United States Patent
Berzins et al.

(10) Patent No.: US 9,419,590 B2
(45) Date of Patent: Aug. 16, 2016

(54) LOW POWER TOGGLE LATCH-BASED FLIP-FLOP INCLUDING INTEGRATED CLOCK GATING LOGIC

(71) Applicant: Samsung Electronics Co., Ltd., Suwon-si, Gyeonggi-do (KR)

(72) Inventors: Matthew Berzins, Cedar Park, TX (US); Christina Wells, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 21 days.

(21) Appl. No.: 14/267,883

(22) Filed: May 1, 2014

(65) Prior Publication Data

US 2015/0200652 A1    Jul. 16, 2015

Related U.S. Application Data

(60) Provisional application No. 61/926,248, filed on Jan. 10, 2014.

(51) Int. Cl.
*H03K 3/012* (2006.01)
*H03K 3/037* (2006.01)

(52) U.S. Cl.
CPC ............. *H03K 3/012* (2013.01); *H03K 3/037* (2013.01); *H03K 3/0372* (2013.01)

(58) Field of Classification Search
CPC .......... G11C 19/00; G11C 19/28; H03K 3/00; H03K 3/012; H03K 3/013; H03K 3/286; H03K 3/037; H03K 3/0375

USPC ......................................................... 327/225
See application file for complete search history.

(56) References Cited

U.S. PATENT DOCUMENTS

| | | | |
|---|---|---|---|
| 5,498,988 A | 3/1996 | Reyes et al. | |
| 6,021,504 A * | 2/2000 | Yamasaki | G06F 1/10 713/400 |
| 7,518,426 B1 | 4/2009 | Smith | |
| 7,772,906 B2 | 8/2010 | Naffziger | |
| 8,347,123 B2 | 1/2013 | Schultz | |
| 2002/0040455 A1* | 4/2002 | Nakamura | G11C 29/56 714/719 |
| 2006/0132213 A1* | 6/2006 | Suzuki | H03K 5/15066 327/291 |
| 2008/0301594 A1* | 12/2008 | Jiang | G06F 17/5031 716/134 |
| 2009/0249149 A1* | 10/2009 | Naffziger | H03K 19/007 714/747 |
| 2011/0010684 A1 | 1/2011 | Sato et al. | |

* cited by examiner

*Primary Examiner* — John Poos
*Assistant Examiner* — David Mattison
(74) *Attorney, Agent, or Firm* — Renaissance IP Law Group LLP (57) ABSTRACT

Inventive aspects include integrated clock gating logic that can generate an internal glitch-free clock signal. Inventive aspects further include a toggle latch that is coupled to the integrated clock gating logic. The toggle latch can receive the internal clock signal from the integrated clock gating logic. The toggle latch can toggle and latch a data value responsive to the internal clock signal. The integrated clock gating logic can include a latch to latch a clock gating logic signal responsive to a clock signal. The clock gating logic signal can cause the internal clock signal to be quiescent when the input data to the flip-flop remains constant, thereby conserving power consumption.

11 Claims, 6 Drawing Sheets

LOW POWER TOGGLE LATCH-BASED FLIP-FLOP INCLUDING INTEGRATED CLOCK GATING LOGIC

BACKGROUND

The present inventive concepts relate to semiconductor circuits, and more particularly, to low power toggle latch-based flip-flop circuits including integrated clock gating logic.

Master-slave flip-flops are the most used standard cell in central processing unit (CPU)-based semiconductor circuits. As CPU core counts continue to increase along with the evolution of CPU technology, the number of flip-flops instantiated within a particular CPU design also continues to increase. During normal CPU operations, the data input to flip-flops often have extremely low change activity. But the internal clock activity continues to toggle and burn power. The flip-flops consume the most power in comparison to all other standard cells used in CPU-based semiconductor circuits. The internal clock power consumption continues to burn power at every clock cycle even when the input data to the flip-flop has low change activity. The high consumption of power impacts the longevity of battery life in mobile devices, adds to heat build-up within devices themselves leading to other performance-related issues, and for stationary devices such as computer servers or desktop systems, increases the overall cost of maintaining and powering the equipment.

BRIEF SUMMARY

Inventive concepts may include a toggle latch-based flip-flop circuit that can generate an internal glitch-free clock signal. The integrated clock gating logic can include a latch to latch a clock gating logic signal responsive to a clock signal. The clock gating logic signal can cause the internal clock signal to be quiescent when the input data to the flip-flop remains constant, thereby conserving power consumption.

The toggle latch-based flip-flop circuit can include a first logic gate, a toggle latch that is coupled to an input terminal of the first logic gate, a latch that is coupled to an output terminal of the first logic gate and to a clock, and a second logic gate. The second logic gate can include a first input terminal that is coupled to an output terminal of the latch, a second input terminal that is coupled to the clock, and an output terminal that is coupled to the toggle latch.

The latch can latch a clock gating logic signal received from the output terminal of the first logic gate responsive to the clock. The second logic gate can receive the clock gating logic signal from an output terminal of the latch. The second logic gate can perform a logic operation on the clock gating logic signal and a clock signal generated by the clock. The second logic gate can generate an internal clock signal responsive to the logic operation.

The toggle latch can be coupled to the output terminal of the second logic gate and can receive the internal clock signal from the second logic gate. An output terminal of the toggle latch can be coupled to an input terminal of the toggle latch. The toggle latch can toggle and latch an output signal of the toggle latch responsive to the internal clock signal received from the second logic gate.

The input terminal of the first logic gate can be referred to as a first input terminal. The first logic gate can further include a second input terminal that is configured to receive a data input signal. The first logic gate can be an exclusive-OR (XOR) gate. The first input terminal of the XOR gate can be an inverted input. The second input terminal of the XOR gate can be a non-inverted input.

An output terminal of the toggle latch can be coupled to the first input terminal of the first logic gate. An input terminal of the toggle latch can be coupled to the first input terminal of the first logic gate. The output terminal of the toggle latch can produce an output signal of the flip-flop circuit.

The toggle latch-based flip-flop circuit can further include integrated clock gating logic including the first logic gate, the latch, and the second logic gate. The integrated clock gating logic can provide a glitch-free internal clock signal. The toggle latch can toggle and latch an output signal of the flip-flop responsive to the glitch-free internal clock signal.

In some embodiments, a toggle latch-based flip-flop circuit can include integrated clock gating logic that is configured to generate an internal clock signal, and a toggle latch that is coupled to the integrated clock gating logic and configured to receive the internal clock signal from the integrated clock gating logic. The toggle latch can toggle and latch a data value responsive to the internal clock signal.

The integrated clock gating logic can further include a first logic gate, a latch that is coupled to an output terminal of the first logic gate and to a clock, and a second logic gate. The second logic gate can include a first input terminal that is coupled to an output terminal of the latch, a second input terminal that is coupled to the clock, and an output terminal that is configured to transmit the internal clock signal.

The latch can latch a clock gating logic signal received from an output terminal of the first logic gate responsive to the clock. The second logic gate can receive the clock gating logic signal from an output terminal of the latch. The second logic gate can perform a logic operation on the clock gating logic signal and a clock signal generated by the clock. The second logic gate is configured to generate the internal clock signal responsive to the logic operation.

The toggle latch can further include a first inverter, a transmission gate coupled to the first inverter, a biasing inverter coupled to the transmission gate, a first latch coupled to the biasing inverter, a second inverter coupled to the biasing inverter, and a second latch coupled to the second inverter.

An output terminal of the second inverter can be coupled to an input terminal of the first inverter. The toggle latch can toggle and latch an output signal of the second inverter responsive to the internal clock signal received from the integrated clock gating logic.

According to some embodiments of the inventive concept, a method for gating a clock signal received by a toggle latch-based flip-flop circuit can include generating, by a first logic gate, a clock gating logic signal based at least on an input data value to the flip-flop circuit and an output value from the flip-flop circuit. The method can further include latching, by a latch, the clock gating logic signal responsive to a clock signal. The method can further include receiving, by a second logic gate, the latched clock gating logic signal and the clock signal. The method can further include gating, by the second logic gate, the clock signal responsive to the latched clock gating logic signal. The method can further include generating, by the second logic gate, an internal clock signal. The method can further include toggling and latching, by a toggle latch, the output value responsive to the internal clock signal. Generating the internal clock signal can further comprise generating, by the second logic gate, a glitch-free internal clock signal.

Some embodiments of the inventive concept can comprise a system including a bus, a memory coupled to the bus, and processing logic coupled to the bus and to the memory. The processing logic can includes one or more toggle latch-based flip-flop circuits. The one or more toggle latch-based flip-flop circuits can each comprise a first logic gate, a toggle latch that is coupled to an input terminal of the first logic gate, a latch that is coupled to an output terminal of the first logic gate and to a clock, and a second logic gate. The second logic gate can include a first input terminal that is coupled to an output terminal of the latch, a second input terminal that is coupled to the clock, and an output terminal that is coupled to the toggle latch.

Certain of the inventive features may be best achieved by implementing them in a processor such as within ARM processor core. Other types of processors or application specific integrated circuits (ASICs) can implement the inventive principles disclosed herein. The inventive concepts may be implemented within processors and/or memory modules of a variety of mobile devices such as smart phones, tablets, notebook computers, or the like, or in a variety of stationary devices such as desktop computers, routers, embedded devices, or the like.

BRIEF DESCRIPTION OF THE DRAWINGS

The foregoing and additional features and advantages of the present inventive principles will become more readily apparent from the following detailed description, made with reference to the accompanying figures, in which.

DETAILED DESCRIPTION

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first circuit could be termed a second circuit, and, similarly, a second circuit could be termed a first circuit, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

In accordance with embodiments of the inventive concept, a low power toggle latch-based flip-flop disables its internal clock activity when it detects the input does not require the output to change. The low power toggle latch-based flip-flop can detect if an output needs to change based on a data input state. If the data input state does not require change at the output, this flip-flop can disable the internal clock. If data at the input is new data, this flip-flop can toggle the output. In such manner, the internal clock activity can be disabled when the input data to the flip-flop remains constant. In other words, during quiescent input, the flip-flop significantly reduces its dynamic power consumption. Integrated clock gating logic can gate or otherwise disable the internal clock. In addition, a toggle latch is used to toggle the output when new input data is detected.

Figure 1A:
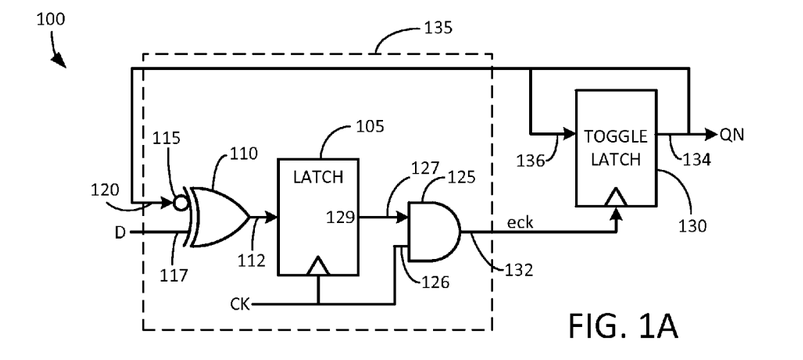
FIG. 1A is an example circuit diagram of a low power toggle latch-based flip-flop including integrated clock gating logic in accordance with embodiments of the inventive concept.
Figure 1B:
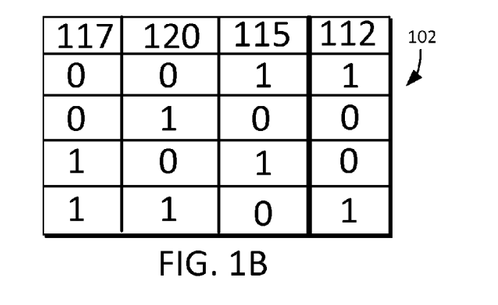
FIG. 1B is an example chart of a truth table associated with a logic gate within the toggle latch-based flip-flop circuit of FIG. 1A in accordance with embodiments of the inventive concept.

FIG. 1A is an example circuit diagram of a low power toggle latch-based flip-flop 100 including integrated clock gating logic in accordance with embodiments of the inventive concept. FIG. 1B is an example chart of a truth table 102 associated with a logic gate 110 within the toggle latch-based flip-flop circuit 100 of FIG. 1A in accordance with embodiments of the inventive concept. Reference is now made to FIGS. 1A and 1B.

As shown in FIG. 1A, a clock signal generated by the clock CK is gated by the logic gate 125 so that it is not propagated through the flip-flop unless needed. If the data input D does not require change at the output QN, then the logic gate 125 disables the internal clock signal eck. If the data input D is new data, then the flip-flop toggles the output QN.

More specifically, the toggle latch-based flip-flop circuit 100 can include a first logic gate 110, a toggle latch 130 that is coupled to an input terminal 120 of the first logic gate 110, a latch 105 that is coupled to an output terminal 112 of the first logic gate 110. The latch 105 is coupled to the clock CK. In addition, the flip-flop circuit 100 can include a second logic gate 125. The second logic gate 125 can include a first input terminal 127 that is coupled to an output terminal 129 of the latch, a second input terminal 126 that is coupled to the clock CK, and an output terminal 132 that is coupled to the toggle latch 130.

The first logic gate 110 can be an exclusive OR (XOR) logic gate. The XOR logic gate 110 can include an inverted input terminal 115 a non-inverted input terminal 117. The non-inverted input terminal 117 can receive a data input signal D. The second logic gate 125 can be an AND gate. It will be understood that other kinds of logic gates forming equivalents or substantial equivalents to such gates can be used without departing from the inventive concept.

FIG. 1B illustrates a truth table for the first logic gate 110. The truth table 102 includes columns for the terminal 117 of the first logic gate 110, terminal 120 of the first logic gate 110, the inverted terminal 115 of the first logic gate 110, and the output terminal 112 of the first logic gate 110. The output data value transmitted by the output terminal 112 depends on the input data value D and the current output data value QN. For example, when the input data value D at terminal 117 is a logical zero (0) and the current output data value QN at terminal 120 is a logical 0, then the output data value transmitted by the output terminal 112 is a logical one (1). By way of another example, when the input data value D at terminal 117 is a logical 0 and the current output data value QN at terminal 120 is a logical 1, then the output data value transmitted by the output terminal 112 is a logical 0. By way of yet another example, when the input data value D at terminal 117 is a logical 1 and the current output data value QN at terminal 120 is a logical 0, then the output data value transmitted by the output terminal 112 is a logical 0. By way of still another example, when the input data value D at terminal 117 is a logical 1 and the current output data value QN at terminal 120 is a logical 1, then the output data value transmitted by the output terminal 112 is a logical 1.

The latch 105 can latch a clock gating logic signal received from the output terminal 112 of the first logic gate 110 responsive to the clock CK. In some embodiments, the clock gating logic signal is latched by the latch 105 on a substantially rising edge of the clock CK.

The second logic gate 125 can receive the clock gating logic signal from an output terminal 129 of the latch 105. The second logic gate 125 can perform a logic operation on the clock gating logic signal and the clock signal generated by the clock CK. For example, the second logic gate 125 can perform a logical AND operation on these signals. The second logic gate 125 can generate an internal clock signal eck responsive to the logic operation.

The toggle latch 130 can be coupled to the output terminal 132 of the second logic gate 125 and can receive the internal clock signal eck from the second logic gate 125. An output terminal 134 of the toggle latch 130 can be coupled to an input terminal 136 of the toggle latch 130. The output terminal 134 of the toggle latch 130 can be coupled to the first input terminal 120 of the first logic gate 110. The input terminal 136 of the toggle latch 130 can also be coupled to the first input terminal 120 of the first logic gate 110.

The toggle latch 130 can toggle and latch an output signal QN of the toggle latch 130 responsive to the internal clock signal eck received from the second logic gate 125. For example, the toggle latch 130 can toggle and latch the output signal QN of the toggle latch 130 responsive to a substantially rising edge of the internal clock signal eck. The output terminal 134 of the toggle latch 130 can produce the output signal QN of the flip-flop circuit 100.

Integrated clock gating logic 135 can include the first logic gate 110, the latch 105, and the second logic gate 125. The integrated clock gating logic 135 can provide a glitch-free internal clock signal eck. The toggle latch 130 can toggle and latch the output signal QN of the flip-flop 100 responsive to the glitch-free internal clock signal eck.

The flip-flop 100, with integrated clock gating 135 and toggle latch 130, can disable internal clock and data activity, thereby significantly reducing dynamic power by up to 70% when it detects the input does not require the output QN to change. The operation of the low power toggle latch-based flip flop circuit 100 is further described below with reference to the waveform diagram of FIG. 6.

Figure 2:
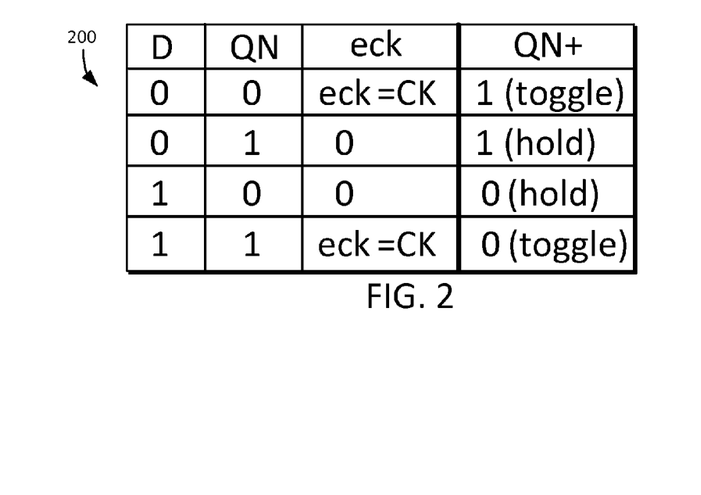
FIG. 2 is an example chart of a truth table associated with the toggle latch-based flip-flop circuit of FIG. 1A in accordance with embodiments of the inventive concept.

FIG. 2 is an example chart of a truth table 200 associated with the toggle latch-based flip-flop circuit 100 of FIG. 1A in accordance with embodiments of the inventive concept. The truth table 200 includes columns for the input data value D, the current output data value QN, the state of the internal clock signal eck, and the next output data value QN+. The next output data value QN+ depends on the input data value D and the current output data value QN.

For example, when the input data value D is a logical 0 and the current output data value QN is a logical 0, then the internal clock signal eck is equal to the clock signal generated by the clock CK, which strobes the toggle latch 130 (of FIG. 1A), thereby causing the current output data value QN to be toggled to a logical 1 (i.e., the next output date value QN+). By way of another example, when the input data value D is a logical 0 and the current output data value QN is a logical 1, then the internal clock signal eck is gated (i.e., the internal cock signal eck is disabled or set to a logical 0), thereby causing the current output data value QN to be held at a logical 1 value (i.e., the next output date value QN+). By way of yet another example, when the input data value D is a logical 1 and the current output data value QN is a logical 0, then the internal clock signal eck is gated (i.e., the internal cock signal eck is disabled or set to a logical 0), thereby causing the current output data value QN to be held at a logical 0 value (i.e., the next output date value QN+). By way of still another example, when the input data value D is a logical 1 and the current output data value QN is a logical 1, then the internal clock signal eck is equal to the clock signal generated by the clock CK, which strobes the toggle latch 130 (of FIG. 1A), thereby causing the current output data value QN to be toggled to a logical 0 (i.e., the next output date value QN+).

Figure 3A:
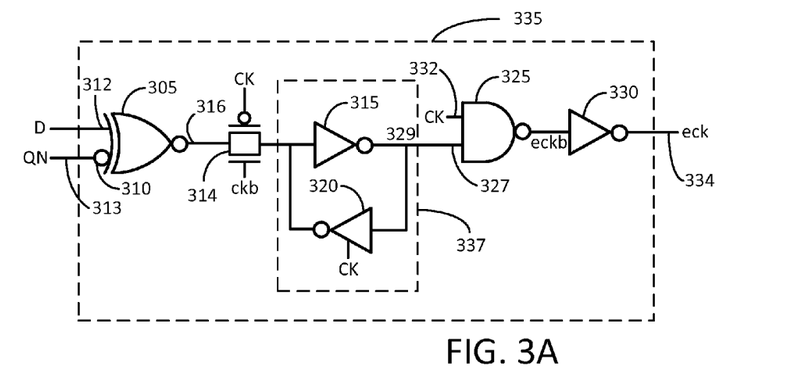
FIG. 3A is an example circuit diagram of integrated clock gating logic in accordance with embodiments of the inventive concept.
Figure 3B:
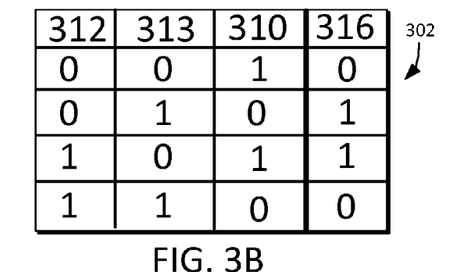
FIG. 3B is an example chart of a truth table associated with a logic gate within the integrated clock gating logic of FIG. 3A in accordance with embodiments of the inventive concept.
Figure 4:
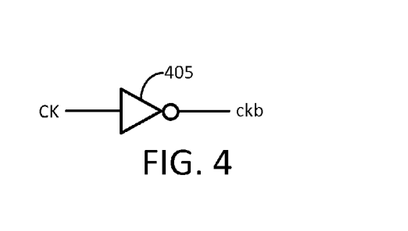
FIG. 4 is an example circuit diagram of clock inverter in accordance with embodiments of the inventive concept.
Figure 5:
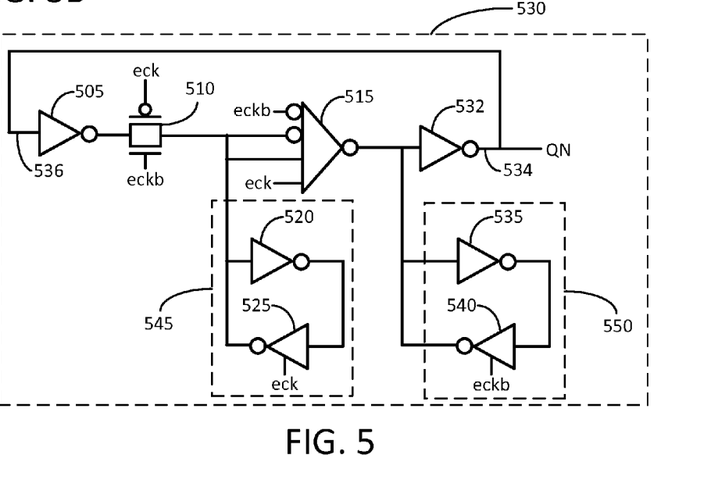
FIG. 5 is an example circuit diagram of a toggle latch in accordance with embodiments of the inventive concept.

FIG. 3A is an example circuit diagram of integrated clock gating logic 335 in accordance with embodiments of the inventive concept. FIG. 3B is an example chart of a truth table 302 associated with a logic gate 305 within the integrated clock gating logic 335 of FIG. 3A in accordance with embodiments of the inventive concept. FIG. 4 is an example circuit diagram of clock inverter 405 in accordance with embodiments of the inventive concept. FIG. 5 is an example circuit diagram of a toggle latch 530 in accordance with embodiments of the inventive concept. Reference is now made to FIGS. 3A, 3B, 4, and 5.

The toggle latch-based flip-flop circuit can include integrated clock gating logic 335 that can generate an internal clock signal eck. A toggle latch 530 can be coupled to the integrated clock gating logic 335. The toggle latch 530 can receive the internal clock signal eck from the integrated clock gating logic 335. The toggle latch 530 can toggle and latch a data value QN responsive to the internal clock signal eck. For example, the toggle latch 530 can toggle and latch a data value QN responsive to a substantially rising edge of the internal clock signal eck.

The integrated clock gating logic 335 can include a first logic gate 305. The first logic gate 305 can be an exclusive NOR (XNOR) gate. The XNOR gate can include a non-inverting input terminal 312 to receive an input data value D, and an inverting input terminal 310 to receive a current output data value QN.

FIG. 3B illustrates a truth table for the first logic gate 305. The truth table 302 includes columns for the terminal 312 of the first logic gate 305, terminal 313 of the first logic gate 305, the inverted terminal 310 of the first logic gate 305, and the output terminal 316 of the first logic gate 305. The output data value transmitted by the output terminal 316 depends on the input data value D and the current output data value QN. For example, when the input data value D at terminal 312 is a logical 0 and the current output data value QN at terminal 313 is a logical 0, then the output data value transmitted by the output terminal 316 is a logical 0. By way of another example, when the input data value D at terminal 312 is a logical 0 and the current output data value QN at terminal 313 is a logical 1, then the output data value transmitted by the output terminal 316 is a logical 1. By way of yet another example, when the input data value D at terminal 312 is a logical 1 and the current output data value QN at terminal 313 is a logical 0, then the output data value transmitted by the output terminal 316 is a logical 1. By way of still another example, when the input data value D at terminal 312 is a logical 1 and the current output data value QN at terminal 313 is a logical 1, then the output data value transmitted by the output terminal 316 is a logical 0.

Transmission gate 314 can transmit a clock gating logic signal from the first logic gate 305 to a latch 337. The transmission gate 314 can be controlled by the clock CK and an inverted clock ckb. The inverted clock ckb can be generated using a clock inverter 405 as shown in FIG. 4.

The latch 337 can be coupled to an output terminal 316 of the first logic gate 305 and to the clock CK. The latch 337 can include an inverter 315 and a tri-state inverter 320. The tri-state inverter 320 can be controlled by the clock CK. The inverter 315 and the tri-state inverter 320 can be arranged to form a latch circuit. The latch 337 can latch a clock gating logic signal received from an output terminal 316 of the first logic gate 305 responsive to the clock CK.

The integrated clock gating logic 335 can further include a second logic gate 325. The second logic gate 325 can be a NAND gate. The second logic gate 325 can include a first input terminal 327 that is coupled to an output terminal 329 of the latch 337. A second input terminal 332 is coupled to the clock CK. The second logic gate 325 can receive the clock gating logic signal from the output terminal 329 of the latch 337. The second logic gate 325 can perform a logic operation on the clock gating logic signal and a clock signal generated by the clock CK. For example, the second logic gate 325 can perform a NAND logic operation. The second logic gate is configured to generate the inverted internal clock signal eckb responsive to the logic operation. The integrated clock gating logic 335 can further include an inverter 330 to invert the inverted internal clock signal eckb received from the second logic gate 325 to produce the internal clock signal eck. An output terminal 334 can transmit the internal clock signal eck.

The toggle latch 530 (of FIG. 5) can include a first inverter 505, a transmission gate 510 coupled to the first inverter 505, a biasing inverter 515 coupled to the transmission gate 510, a first latch 545 coupled to the biasing inverter 515, a second inverter 532 coupled to the biasing inverter 515, and a second latch 550 coupled to the second inverter 532. An output terminal 534 of the second inverter 532 can be coupled to an input terminal 536 of the first inverter 505. The toggle latch 530 can toggle and latch an output signal 534 of the second inverter 532 responsive to the internal clock signal eck received from the integrated clock gating logic 335.

Each of the latches 545 and 550 can include an inverter (e.g., 520 and 535, respectively) and a tri-state inverter (e.g., 525 and 540, respectively). The tri-state inverter 525 can be controlled by the internal clock signal eck. The tri-state inverter 550 can be controlled by the inverted internal clock signal eckb. The latch 545 can latch a toggled output signal QN received from the transmission gate 510. The biasing inverter 515 can include four inputs. The biasing inverter 515 can include two inverted input terminals and two non-inverted input terminals. The inverter 515 can also be an enabled inverter (i.e., enabled with eck), an inverter to a transmission gate (i.e., where the transmission gate is controlled by eck), or a tri-state inverter (i.e., that is controlled by eck). The output of the inverter 515 can be transmitted to the inverter 532, which inverts the signal, thereby causing a toggled output signal QN+ to be transmitted by the toggle latch 530.

Figure 6:
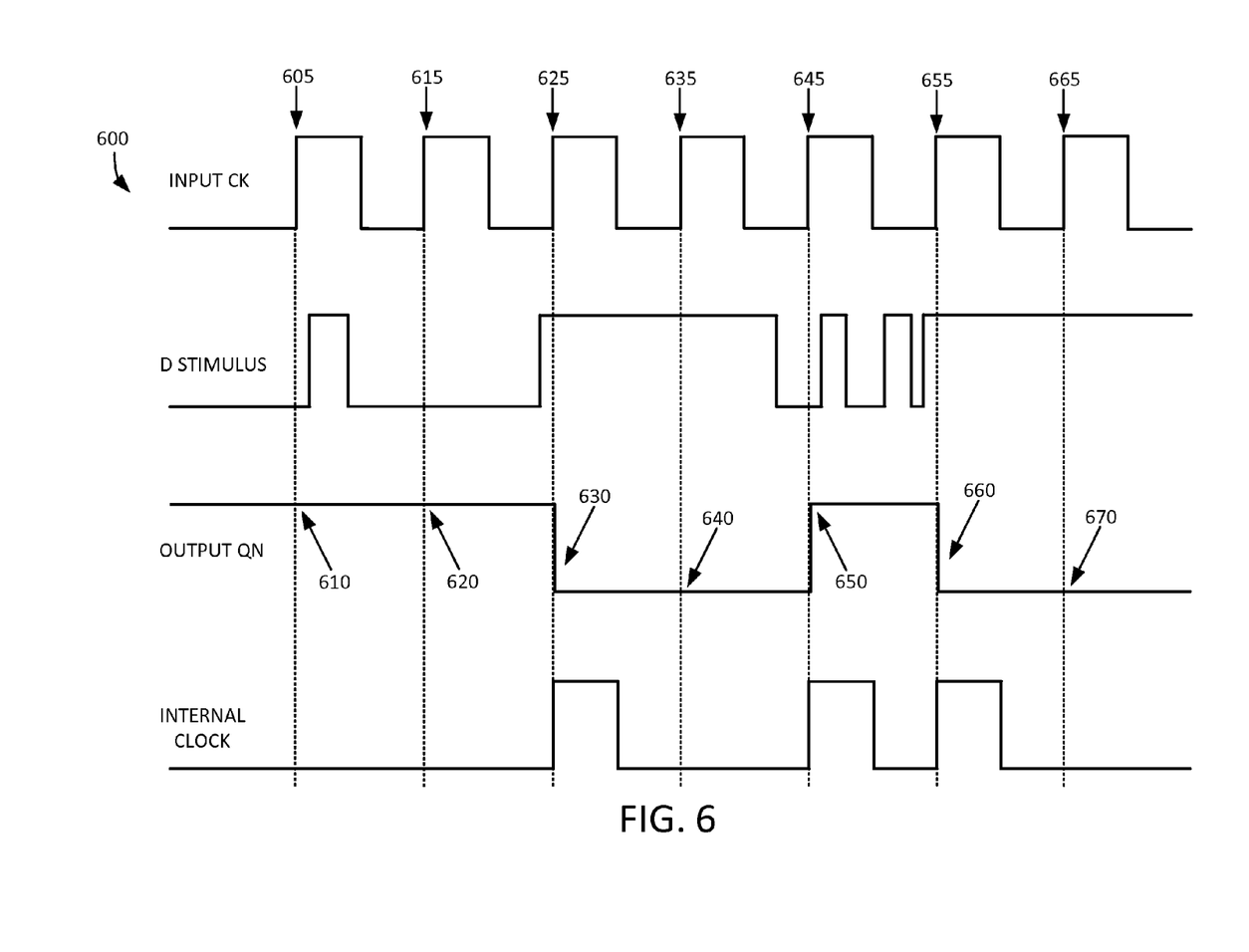
FIG. 6 is an example waveform diagram associated with operation of the low power toggle latch-based flip-flop circuit in accordance with embodiments of the inventive concept.

FIG. 6 is an example waveform diagram 600 associated with operation of the low power toggle latch-based flip-flop circuit in accordance with embodiments of the inventive concept described above. The waveform labeled INPUT CK is an input clock signal that can be a substantially square wave periodic signal. The INPUT CK is referred to above as the clock CK. The INPUT CK is received from a clock that is external to the flip-flop circuit itself. The waveform labeled D STIMULUS represents the data input value (i.e., input signal) received at the input of the flip-flop. The waveform labeled OUTPUT QN represents the data output value (i.e., output signal QN) generated by the flip-flop. The waveform labeled INTERNAL CLOCK represents the internal clock signal, referred to as eck above.

As can be seen in FIG. 6, the INTERNAL CLOCK signal is quiescent during several of the INPUT CK periods. Indeed, the INTERNAL CLOCK signal can remain quiescent (i.e., disabled, gated, and/or set to a logical 0) for any suitable amount of time as long as the input to the flip-flop does not require the output of the flip-flop to change. The next OUTPUT QN value changes responsive to the state of the current OUTPUT QN value and the D STIMULUS.

For example, at time 605, the current OUTPUT QN value is a logical 1 and the value of D STIMULUS is a logical 0. According to the truth table 200 of FIG. 2 and associated flip-flop circuits described above, the INTERNAL CLOCK eck remains quiescent (i.e., disabled, gated, and/or set to a logical 0), and the next OUTPUT QN value is therefore held at a logical 1, as shown at 610.

More specifically, with reference to the flip-flop circuit of FIG. 1A, at time 605, where QN=1 and D=0, the logic gate 110 generates a logical 0 value, which is latched by latch 105. The second logic gate 125 receives the logical 0 value and performs an AND operation with a clock signal generated by the clock CK. This operation gates the clock signal generated by the clock CK such that the internal clock signal eck is quiescent, and therefore, the next OUTPUT QN value (i.e., QN+) value is held at a logical 1, as shown at 610.

With reference to the integrated clock gating logic 335 of FIG. 3A, at time 605, where QN=1 and D=0, the logic gate 305 generates a logical 1 value, which is latched by latch 337. The latch 337 inverts the logical 1 to a logical 0 value, which is transmitted to the second logic gate 325. The second logic gate 325 receives the logical 0 value and performs a NAND operation with the clock signal generated by the clock CK. This operation produces the inverted internal clock signal eckb, in this case logical 1, which is inverted by inverter 330 to become the internal clock signal eck, in this case logical 0, which gates the clock signal generated by the clock CK such that the internal clock signal eck is quiescent. Consequently, the next OUTPUT QN value (i.e., QN+) value is held at a logical 1, as shown at 610.

By way of another example, at time 615, the current OUTPUT QN value is a logical 1 and the value of D STIMULUS is a logical 0, which is similar to the previous example. According to the truth table 200 of FIG. 2 and associated flip-flop circuits described above, the INTERNAL CLOCK eck remains quiescent (i.e., disabled, gated, and/or set to a logical 0), and the next OUTPUT QN value is therefore held at a logical 1, as shown at 620.

By way of yet another example, at time 625, the current OUTPUT QN value is a logical 1 and the value of D STIMULUS is a logical 1. According to the truth table 200 of FIG. 2 and associated flip-flop circuits described above, the INTERNAL CLOCK eck is substantially equivalent to the CK signal (e.g., by operation of the integrated clock gating logic), and the next OUTPUT QN value is therefore toggled from a logical 1 to a logical 0, as shown at 630.

More specifically, with reference to the flip-flop circuit of FIG. 1A, at time 625, where QN=1 and D=1, the logic gate 110 generates a logical 1 value, which is latched by latch 105. The second logic gate 125 receives the logical 1 value and performs an AND operation with the clock signal generated by the clock CK. This operation causes the clock signal generated by the clock CK to pass through the second logic gate 125 as the internal clock signal eck, and therefore, the next OUTPUT QN value (i.e., QN+) value is toggled from a logical 1 to a logical 0, as shown at 630.

With reference to the integrated clock gating logic 335 of FIG. 3A, at time 625, where QN=1 and D=1, the logic gate 305 generates a logical 0 value, which is latched by latch 337. The latch 337 inverts the logical 0 to a logical 1 value, which is transmitted to the second logic gate 325. The second logic gate 325 receives the logical 1 value and performs a NAND operation with the clock signal generated by the clock CK. This operation produces the inverted internal clock signal eckb, in this case logical 0, which is inverted by inverter 330 to become the internal clock signal eck, in this case logical 1, which causes the internal clock signal eck to be substantially equivalent to the clock signal generated by the clock CK for a period, and therefore, the next OUTPUT QN value (i.e., QN+) value is toggled from a logical 1 to a logical 0, as shown at 630.

By way of still another example, at time 635, the current OUTPUT QN value is a logical 0 and the value of D STIMULUS is a logical 1. According to the truth table 200 of FIG. 2 and associated flip-flop circuits described above, the INTERNAL CLOCK eck remains quiescent (i.e., disabled, gated, and/or set to a logical 0), and the next OUTPUT QN value is therefore held to a logical 0, as shown at 640.

More specifically, with reference to the flip-flop circuit of FIG. 1A, at time 635, where QN=0 and D=1, the logic gate 110 generates a logical 0 value, which is latched by latch 105. The second logic gate 125 receives the logical 0 value and performs an AND operation with a clock signal generated by the clock CK. This operation gates the clock signal generated by the clock CK such that the internal clock signal eck is quiescent, and therefore, the next OUTPUT QN value (i.e., QN+) value is held at a logical 0, as shown at 640.

With reference to the integrated clock gating logic 335 of FIG. 3A, at time 635, where QN=0 and D=1, the logic gate 305 generates a logical 1 value, which is latched by latch 337. The latch 337 inverts the logical 1 to a logical 0 value, which is transmitted to the second logic gate 325. The second logic gate 325 receives the logical 0 value and performs a NAND operation with a clock signal generated by the clock CK. This operation produces the inverted internal clock signal eckb, in this case logical 1, which is inverted by inverter 330 to become the internal clock signal eck, in this case logical 0, which gates the clock signal generated by the clock CK such that the internal clock signal eck is quiescent. Consequently, the next OUTPUT QN value (i.e., QN+) value is held at a logical 0, as shown at 640.

By way of another example, at time 645, the current OUTPUT QN value is a logical 0 and the value of D STIMULUS is a logical 0. According to the truth table 200 of FIG. 2 and associated flip-flop circuits described above, the INTERNAL CLOCK eck is substantially equivalent to the CK signal (e.g., by operation of the integrated clock gating logic), and the next OUTPUT QN value is therefore toggled from a logical 0 to a logical 1, as shown at 650.

More specifically, with reference to the flip-flop circuit of FIG. 1A, at time 645, where QN=0 and D=0, the logic gate 110 generates a logical 1 value, which is latched by latch 105. The second logic gate 125 receives the logical 1 value and performs an AND operation with a clock signal generated by the clock CK. This operation causes the clock signal generated by the clock CK to pass through the second logic gate 125 as the internal clock signal eck for a period, and therefore, the next OUTPUT QN value (i.e., QN+) value is toggled from a logical 0 to a logical 1, as shown at 650.

With reference to the integrated clock gating logic 335 of FIG. 3A, at time 645, where QN=0 and D=0, the logic gate 305 generates a logical 0 value, which is latched by latch 337. The latch 337 inverts the logical 0 to a logical 1 value, which is transmitted to the second logic gate 325. The second logic gate 325 receives the logical 1 value and performs a NAND operation with a clock signal generated by the clock CK. This operation produces the inverted internal clock signal eckb, in this case logical 0, which is inverted by inverter 330 to become the internal clock signal eck, in this case logical 1, which causes the internal clock signal eck to be substantially equivalent to the clock signal generated by the clock CK for a period, and therefore, the next OUTPUT QN value (i.e., QN+) value is toggled from a logical 0 to a logical 1, as shown at 650.

By way of another example, at time 655, the current OUTPUT QN value is a logical 1 and the value of D STIMULUS is a logical 1. According to the truth table 200 of FIG. 2 and associated flip-flop circuits described above, the INTERNAL CLOCK eck is substantially equivalent to the CK signal (e.g., by operation of the integrated clock gating logic), and the next OUTPUT QN value is therefore toggled from a logical 1 to a logical 0, as shown at 660.

By way of still another example, at time 665, the current OUTPUT QN value is a logical 0 and the value of D STIMULUS is a logical 1. According to the truth table 200 of FIG. 2 and associated flip-flop circuits described above, the INTERNAL CLOCK eck remains quiescent (i.e., disabled, gated, and/or set to a logical 0), and the next OUTPUT QN value is therefore held to a logical 0, as shown at 670.

As can be seen in FIG. 6, a glitch-free INTERNAL CLOCK eck signal is produced. In other words, the glitch-free INTERNAL CLOCK eck signal, when enabled, can substantially mimic the waveform of the INPUT CK signal for one or more clock periods without spikes or other abnormalities. This is possible due to the integrated clock gating logic as described and illustrated herein. Moreover, if the D STIMULUS does not require change at the OUTPUT QN, then the INTERNAL CLOCK eck signal is quiescent, thereby reducing power consumption.

Figure 7:
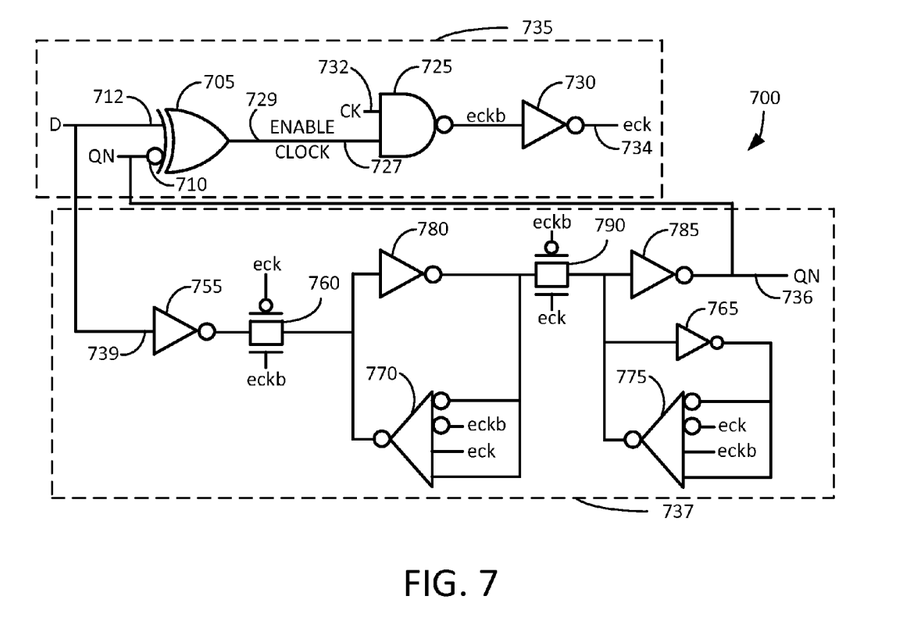
FIG. 7 is another example circuit diagram of a low power toggle latch-based flip-flop in accordance with embodiments of the inventive concept.

FIG. 7 is another example circuit diagram of a low power toggle latch-based flip-flop 700 in accordance with embodiments of the inventive concept. In this embodiment, the toggle latch-based flip-flop circuit 700 can include integrated clock gating logic 735 that can generate an internal clock signal eck. A toggle latch 737 can be coupled to the integrated clock gating logic 735. The toggle latch 737 can receive the internal clock signal eck from the integrated clock gating logic 735. The toggle latch 737 can toggle and latch a data value D responsive to the internal clock signal eck. For example, the toggle latch 737 can toggle and latch a data value D responsive to a substantially rising edge of the internal clock signal eck.

The integrated clock gating logic 735 can include a first logic gate 705. The first logic gate 705 can be an exclusive OR (XOR) gate. The XOR gate 705 can include a non-inverting input terminal 712 to receive an input data value D, and an inverting input terminal 710 to receive a current output data value QN. The truth table 102 of FIG. 1A is applicable to the XOR gate 705, and therefore, a description of this is not repeated.

The first logic gate 705 can transmit a clock gating logic signal from the first logic gate 705 to a second logic gate 725. The second logic gate 725 can be a NAND gate. The second logic gate 725 can include a first input terminal 727 that is coupled to an output terminal 729 of the first logic gate 705. A second input terminal 732 is coupled to the clock CK. The second logic gate 725 can receive an enable clock signal from the output terminal 729 of the first logic gate 705. The second logic gate 725 can perform a logic operation on the enable clock signal and a clock signal generated by the clock CK. For example, the second logic gate 725 can perform a NAND logic operation. The second logic gate 725 is configured to generate the inverted internal clock signal eckb responsive to the logic operation. The integrated clock gating logic 735 can further include an inverter 730 to invert the inverted internal clock signal eckb received from the second logic gate 725 to produce the internal clock signal eck. An output terminal 734 can transmit the internal clock signal eck.

The toggle latch 737 can include an inverter 755, a transmission gate 760 coupled to the inverter 755, a biasing inverter 770 coupled to the transmission gate 760, an inverter 780 coupled to the biasing inverter 770, and a transmission gate 790 coupled to the biasing inverter 770 and to the inverter 780. In addition, the transmission gate 790 can be coupled to an inverter 785, which outputs the data value QN. Moreover, the transmission gate 790 can be coupled to an inverter 765, a biasing inverter 775. An output terminal 736 of the inverter 785 can be coupled to an input terminal 739 of the inverter 755. The toggle latch 737 can toggle and latch an output signal QN responsive to the internal clock signal eck received from the integrated clock gating logic 735.

Figure 8:
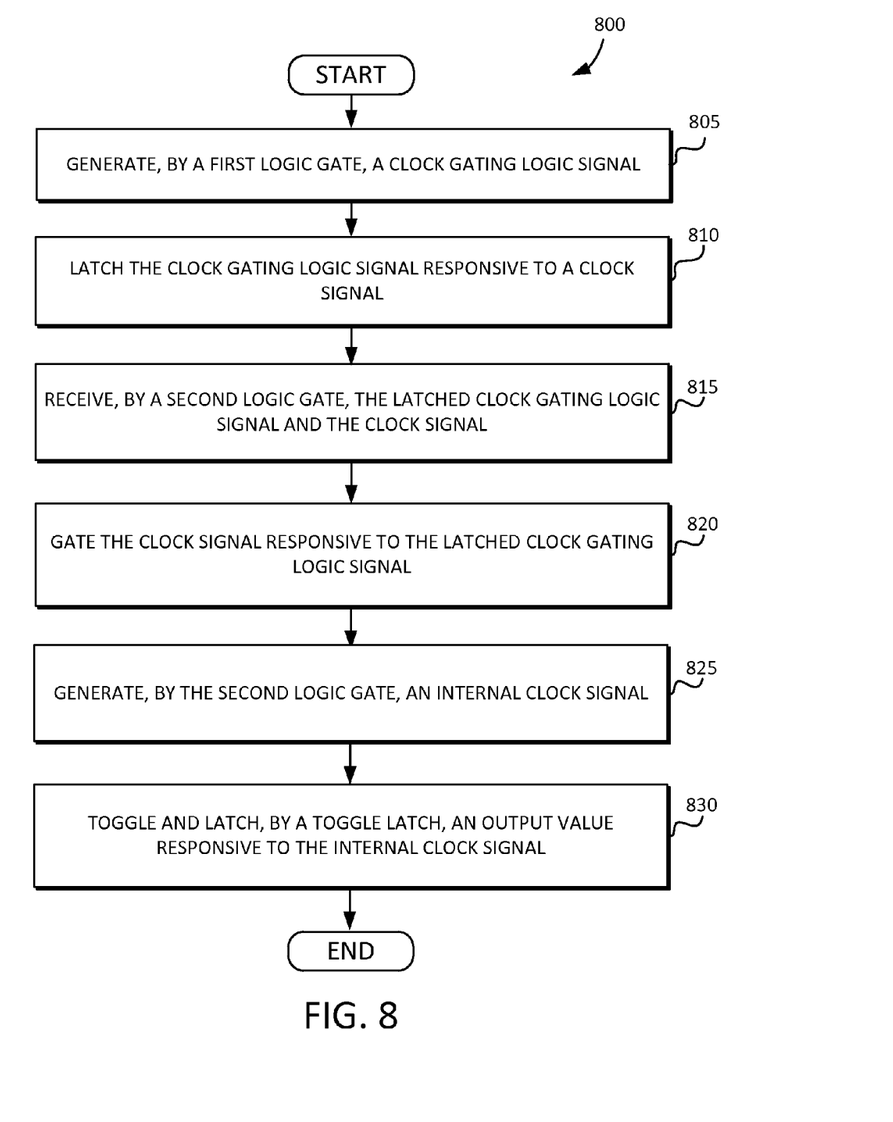
FIG. 8 is a flow diagram illustrating a technique for gating a clock signal received by a toggle latch-based flip-flop circuit in accordance with embodiments of the inventive concept.

FIG. 8 is a flow diagram 800 illustrating a technique for gating a clock signal received by a toggle latch-based flip-flop circuit in accordance with embodiments of the inventive concept. The technique begins at 805 where a clock gating logic signal can be generated, by a first logic gate, based at least on an input data value D to the flip-flop circuit and an output value QN from the flip-flop circuit. The flow proceeds to 810 where the clock gating logic signal can be latched, by a latch, responsive to a clock signal. At 815, the latched clock gating logic signal and the clock signal are received, by a second logic gate. At 820, the clock signal can be gated, by the second logic gate, responsive to the latched clock gating logic signal. At 825, an internal clock signal can be generated, by the second logic gate. The output value can be toggled and latched, at 830, by a toggle latch, responsive to the internal clock signal. In some embodiments, the second logic gate can generate a glitch-free internal clock signal.

Figure 9:
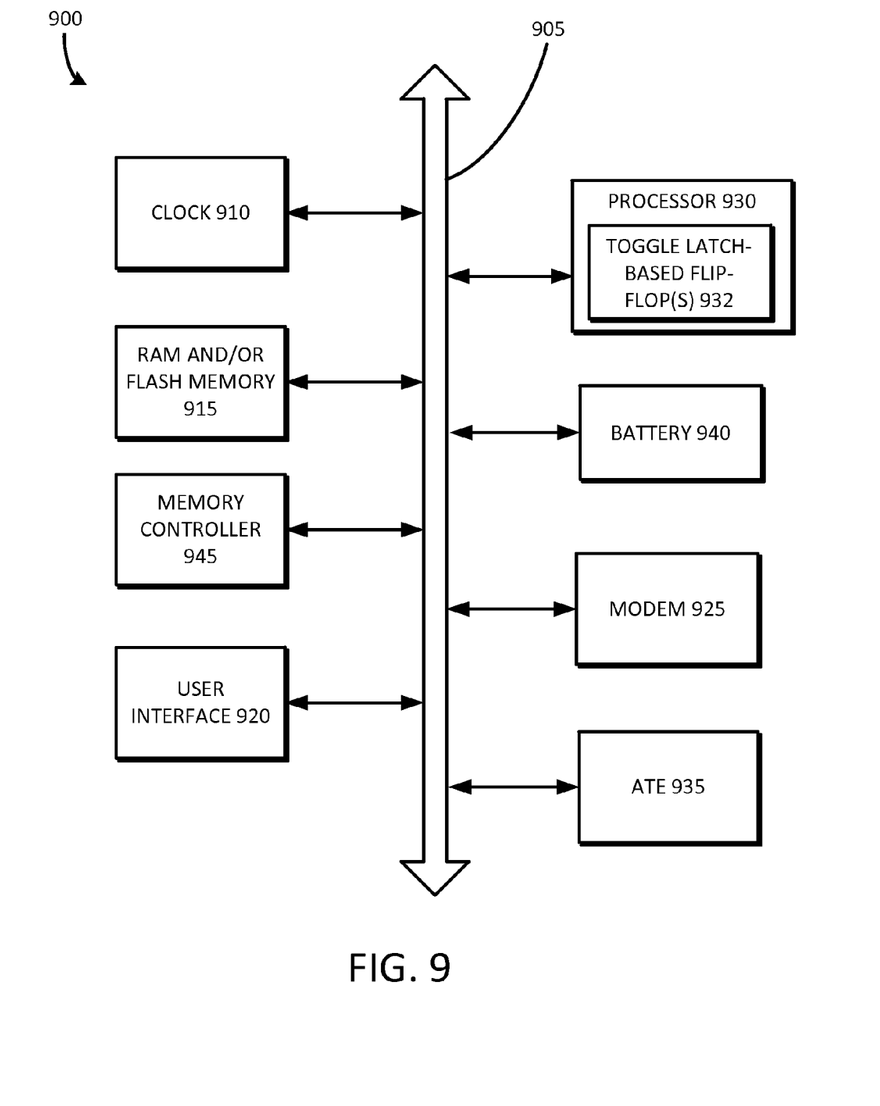
FIG. 9 is an example block diagram of a computing system including a processor and associated toggle latch-based flip flop(s) according to embodiments of the inventive concept as disclosed herein.

FIG. 9 is an example block diagram of a computing system 900 including processor 930 and associated toggle latch-based flip-flop(s) 932 according to embodiments of the inventive concept as disclosed herein. The toggle latch-based flip-flop(s) 932 are described in detail above, and therefore, such description is not repeated. The processor 930 may be electrically connected to a system bus 905. The computing system 900 may also include a clock 910, a random access memory (RAM) and/or flash memory 915, a memory controller 945, a user interface 920, a modem 925 such as a baseband chipset, and/or automated test equipment (ATE) 935, any or all of which may be electrically coupled to the system bus 905.

If the computing system 900 is a mobile device, it may further include a battery 940, which powers the computing system 900. Although not shown in FIG. 9, the computing system 900 may further include an application chipset, a camera image processor (CIS), a mobile DRAM, and the like. The memory controller 945 and the flash memory 915 may constitute a solid state drive/disk (SSD), which uses a non-volatile memory to store data.

In example embodiments, the computing system 900 may be used as a computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting a telematics network, RFID, or one of various electronic devices constituting a computing system.

The following discussion is intended to provide a brief, general description of a suitable machine or machines in which certain aspects of the inventive concept can be implemented. Typically, the machine or machines include a system bus to which is attached processors, memory, e.g., random access memory (RAM), read-only memory (ROM), or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the present inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the inventive concept with reference to illustrated embodiments, it will be recognized that the illustrated embodiments can be modified in arrangement and detail without departing from such principles, and can be combined in any desired manner. And although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms can reference the same or different embodiments that are combinable into other embodiments.

Embodiments of the inventive concept may include a non-transitory machine-readable medium comprising instructions executable by one or more processors, the instructions comprising instructions to perform the elements of the inventive concepts as described herein.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

What is claimed is:

1. A toggle latch-based flip-flop circuit, comprising:
    a first logic gate;
    an input terminal of a toggle latch that is directly coupled to a first input terminal of the first logic gate;
    an output terminal of the toggle latch is coupled to the first input terminal of the first logic gate;
    a latch that is coupled to an output terminal of the first logic gate and to a clock; and
    a second logic gate including:
        a first input terminal that is coupled to an output terminal of the latch;
        a second input terminal that is coupled to the clock; and
        an output terminal that is coupled to the toggle latch,
    wherein:
        the first logic gate further includes a data input terminal that is configured to receive a data input signal;
        the first logic gate is an exclusive-OR (XOR) gate;
        the first input terminal of the XOR gate is inverted;
        the data input terminal of the XOR gate is non-inverted;
        in response to the data input signal being a logical 0 and a data output signal on the output terminal of the toggle latch being a logical 0, the toggle latch is configured to toggle the output signal;
        in response to the data input signal being a logical 0 and the data output signal on the output terminal of the toggle latch being a logical 1, the toggle latch is configured to hold the output signal;
        in response to the data input signal being a logical 1 and the data output signal on the output terminal of the toggle latch being a logical 0, the toggle latch is configured to hold the output signal; and
        in response to the data input signal being a logical 1 and the data output signal on the output terminal of the toggle latch being a logical 1, the toggle latch is configured to toggle the output signal.

2. The toggle latch-based flip-flop circuit of claim 1, wherein the latch is configured to latch a clock gating logic signal received from the output terminal of the first logic gate responsive to the clock.

3. The toggle latch-based flip-flop circuit of claim 2, wherein:
    the second logic gate is configured to receive the clock gating logic signal from an output terminal of the latch;
    the second logic gate is configured to perform a logic operation on the clock gating logic signal and a clock signal generated by the clock; and
    the second logic gate is configured to generate an internal clock signal responsive to the logic operation.

4. The toggle latch-based flip-flop circuit of claim 3, wherein the toggle latch is coupled to the output terminal of the second logic gate and is configured to receive the internal clock signal from the second logic gate.

5. The toggle latch-based flip-flop circuit of claim 4, wherein:
    an output terminal of the toggle latch is coupled to the input terminal of the toggle latch; and
    the toggle latch is configured to toggle and latch an output signal of the toggle latch responsive to the internal clock signal received from the second logic gate.

6. The toggle latch-based flip-flop circuit of claim 1, wherein the output terminal of the toggle latch is a data output terminal that is configured to produce a data output signal of the flip-flop circuit, and wherein the inverted first input terminal of the XOR gate is coupled to the data output terminal of the toggle latch and configured to receive the data output signal of the flip-flop circuit.

7. The toggle latch-based flip-flop circuit of claim 1, further comprising:
    integrated clock gating logic including the first logic gate, the latch, and the second logic gate, wherein the integrated clock gating logic is configured to provide a glitch-free internal clock signal.

8. The toggle latch-based flip-flop circuit of claim 7, wherein the toggle latch is configured to toggle and latch an output signal of the flip-flop responsive to the glitch-free internal clock signal.

9. A system, comprising:
    a bus;
    a memory coupled to the bus; and processing logic coupled to the bus and to the memory, wherein the processing logic includes one or more toggle latch-based flip-flop circuits, wherein the one or more toggle latch-based flip-flop circuits each comprise:
   a first logic gate;
   an input terminal of a toggle latch that is directly coupled to a first input terminal of the first logic gate;
   an output terminal of the toggle latch is coupled to the first input terminal of the first logic gate;
   a latch that is coupled to an output terminal of the first logic gate and to a clock; and
   a second logic gate including:
      a first input terminal that is coupled to an output terminal of the latch;
      a second input terminal that is coupled to the clock; and
      an output terminal that is coupled to the toggle latch, wherein:
the first logic gate further includes a data input terminal that is configured to receive a data input signal;
the first logic gate is an exclusive-OR (XOR) gate;
the first input terminal of the XOR gate is inverted;
the data input terminal of the XOR gate is non-inverted;
in response to the data input signal being a logical 0 and a data output signal on the output terminal of the toggle latch being a logical 0, the toggle latch is configured to toggle the output signal;
in response to the data input signal being a logical 0 and the data output signal on the output terminal of the toggle latch being a logical 1, the toggle latch is configured to hold the output signal;
in response to the data input signal being a logical 1 and the data output signal on the output terminal of the toggle latch being a logical 0, the toggle latch is configured to hold the output signal; and
in response to the data input signal being a logical 1 and the data output signal on the output terminal of the toggle latch being a logical 1, the toggle latch is configured to toggle the output signal.

10. The system of claim 9, wherein the output terminal of the toggle latch is a data output terminal that is configured to produce a data output signal of the flip-flop circuit, and wherein the inverted first input terminal of the XOR gate is coupled to the data output terminal of the toggle latch and configured to receive the data output signal of the flip-flop circuit.

11. The system of claim 9, wherein the toggle latch comprises:
   a first inverter;
   a transmission gate coupled to the first inverter;
   a biasing inverter coupled to the transmission gate;
   a first latch coupled to the biasing inverter;
   a second inverter coupled to the biasing inverter; and
   a second latch coupled to the second inverter.

* * * * *